United States Patent
Kyle et al.

(10) Patent No.: US 7,230,826 B2
(45) Date of Patent: Jun. 12, 2007

(54) METHOD AND APPARATUS FOR MOUNTING A FAN

(75) Inventors: Lawrence Alan Kyle, Salado, TX (US); Laurent Andy Regimbal, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 195 days.

(21) Appl. No.: 11/078,139

(22) Filed: Mar. 11, 2005

(65) Prior Publication Data

US 2006/0203447 A1    Sep. 14, 2006

(51) Int. Cl.
*H05K 7/20* (2006.01)

(52) U.S. Cl. ............. 361/695; 361/697; 361/719; 174/16.1; 174/16.3; 165/80.3; 165/122; 415/213.1

(58) Field of Classification Search ............ None
See application file for complete search history.

(56) References Cited

U.S. PATENT DOCUMENTS

| | | | |
|---|---|---|---|
| 6,213,819 B1* | 4/2001 | Fan ........................... | 439/894 |
| 6,435,889 B1* | 8/2002 | Vinson et al. ............ | 439/247 |
| 6,464,578 B1* | 10/2002 | Chin et al. ................ | 454/184 |
| 6,552,898 B1 | 4/2003 | Noble | |
| 6,643,131 B1* | 11/2003 | Huang ...................... | 361/697 |
| 6,667,882 B2* | 12/2003 | Pauser ...................... | 361/695 |
| 6,711,013 B2* | 3/2004 | Wobig et al. ............ | 361/687 |
| 6,722,971 B2 | 4/2004 | Gough | |
| 6,808,411 B2* | 10/2004 | Chen ........................ | 439/485 |
| 6,822,863 B1 | 11/2004 | Artman et al. | |
| 7,009,841 B2* | 3/2006 | Chen et al. ............... | 361/695 |
| 2004/0004812 A1* | 1/2004 | Curlee et al. ............ | 361/687 |
| 2006/0268514 A1* | 11/2006 | Fan et al. ................ | 361/695 |
| 2006/0285292 A1* | 12/2006 | Fan et al. ................ | 361/695 |

OTHER PUBLICATIONS

Search and Examination Report issued by Australian Patent Office, Singapore Patent Application No. 200601306-4, Oct. 11, 2006.

* cited by examiner

*Primary Examiner*—Boris Chervinsky
(74) *Attorney, Agent, or Firm*—Haynes and Boone, LLP

(57) ABSTRACT

A fan mounting apparatus includes a base, a fan mount which is operable to couple to the base, and a latch member pivotally coupled to the fan mount, the latch member operable to reduce vibration from a fan module and including a duct member operable to direct airflow from the fan module. The base may be mounted adjacent a heat sink to provide easy installation of a fan module adjacent the heat sink and for more efficient use of the airflow from the fan module to the heat sink.

25 Claims, 12 Drawing Sheets

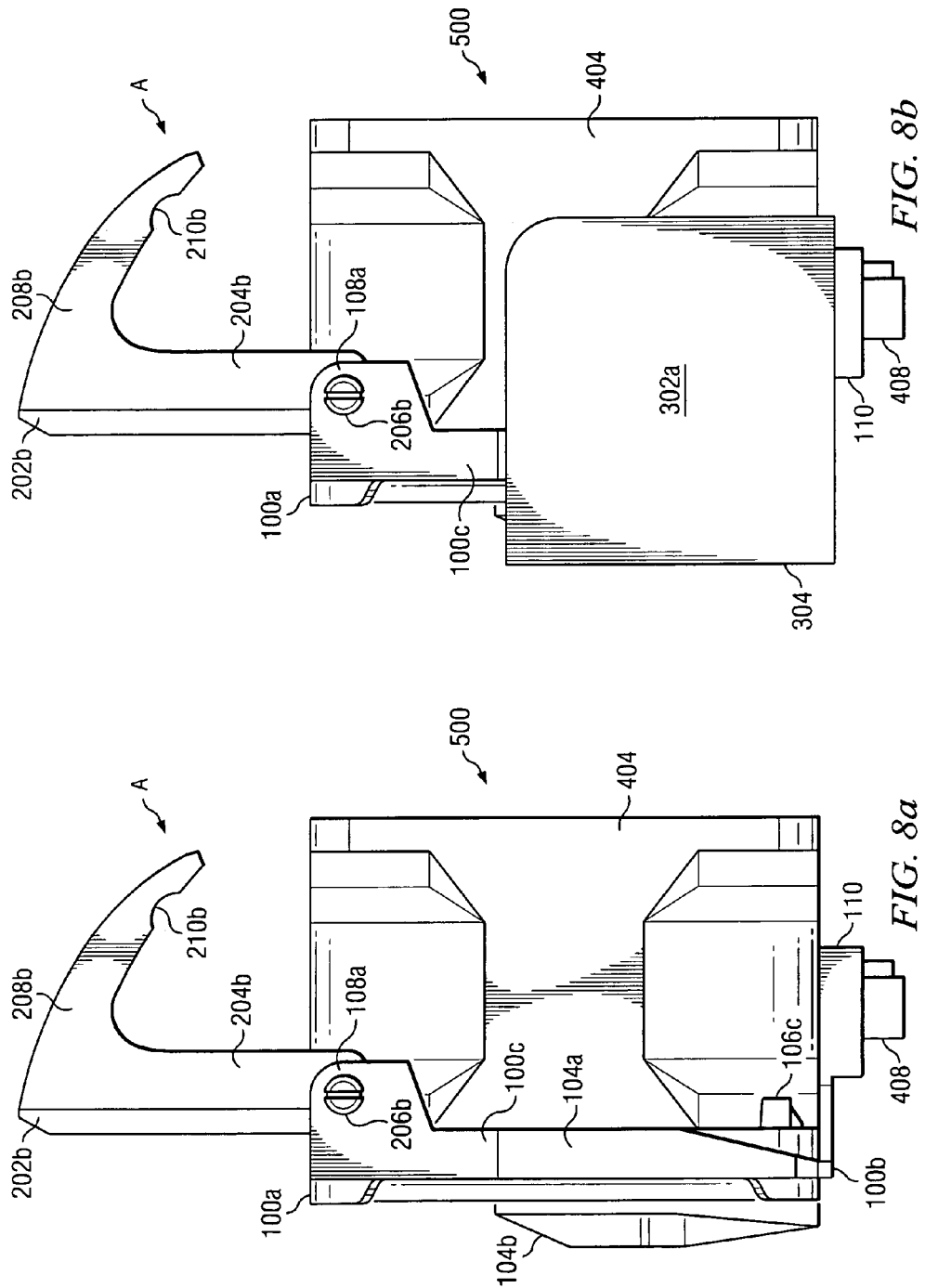

METHOD AND APPARATUS FOR MOUNTING A FAN

BACKGROUND

The present disclosure relates generally to information handling systems, and more particularly to mounting a fan in an information handling system.

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As information handling systems become more and more powerful, the heat output of those information handling systems continue to rise. Fans are typically included in the information handling system for purposes of cooling different components in the information handling system so that they do not overheat and cause damage to the information handling system. The mounting and performance of those fans raise a number of issues.

Conventional mounting of fans to the information handling system can result in vibrations transmitted between the fan and the information handling system. With the strict acoustical requirements associated with some information handling systems, the noise accompanying these vibrations is unacceptable. Furthermore, conventional mounting techniques for fans tend to allow the fan airflow to spread out over areas of the information handling system that may not need it. With the strict thermal requirements associated with some information handling systems, a more efficient use of the fan airflow is required.

Accordingly, it would be desirable to provide a method and apparatus for mounting a fan absent the disadvantages found in the prior methods discussed above.

SUMMARY

According to one embodiment, a fan mounting apparatus is provided that includes a base, a fan mount which is operable to couple to the base, and a latch member pivotally coupled to the fan mount, the latch member operable to reduce vibration from a fan module and including a duct member operable to direct airflow from the fan module.

A principal advantage of this embodiment is that a fan mounting apparatus is provided that reduces vibrations resulting from fan module operation while directing airflow from the fan module to provide a more efficient thermal solution.

BRIEF DESCRIPTION OF THE DRAWINGS

FIG. 2b is a rear perspective view illustrating an embodiment of the fan mount of FIG. 2a.

FIG. 2c is a side view illustrating an embodiment of the fan mount of FIG. 2a.

FIG. 8a is a side view illustrating an embodiment of the fan, the latch member and the fan mount of FIG. 7b with the latch member in the first orientation.

FIG. 8b is a side view illustrating an embodiment of the fan, the latch member and the fan mount of FIG. 7b coupled to the base of FIG. 4.

FIG. 9b is a perspective view illustrating an embodiment of a heat sink coupled to the board and heat producing component of FIG. 9a.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

Figure 1:
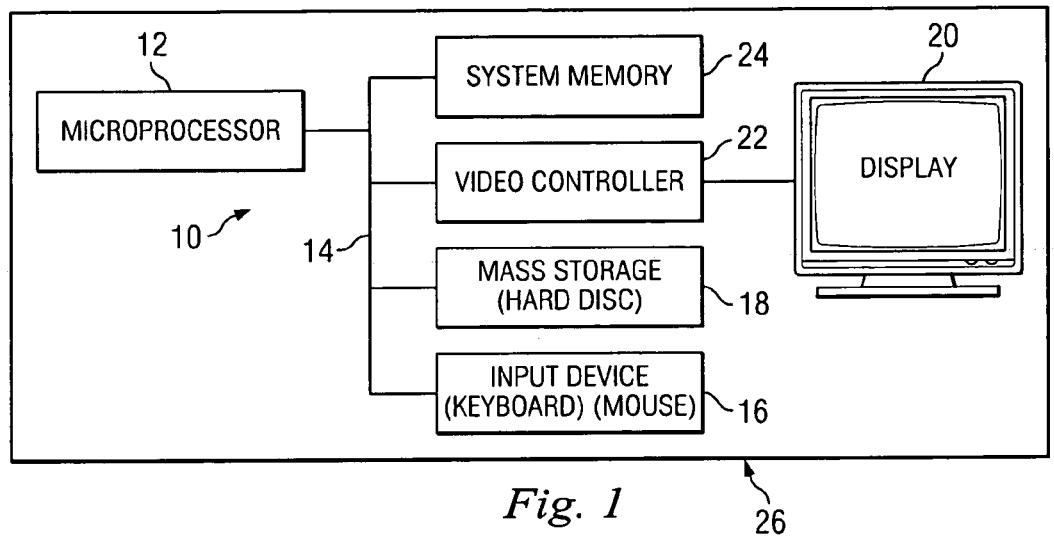
FIG. 1 is a schematic view illustrating an embodiment of an information handling system.

In one embodiment, information handling system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. In an embodiment, a chassis 26 houses some or all of the components of the information handling system 10. It should be understood that other busses and intermediate circuits can be deployed between the components described above and microprocessor 12 to facilitate interconnection between the components and the microprocessor.

Figure 2A:
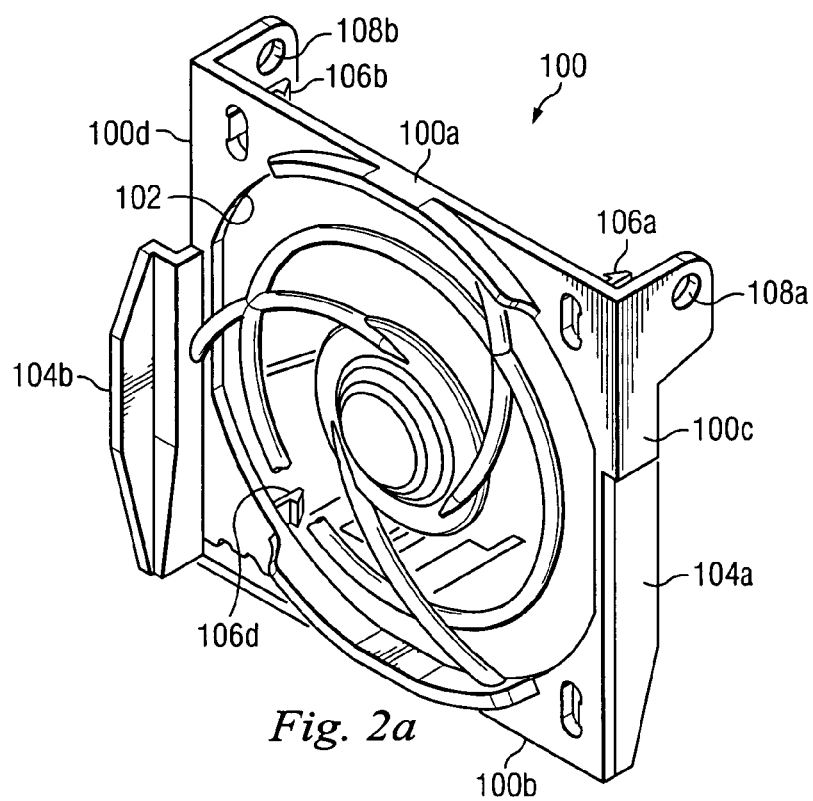
FIG. 2a is a front perspective view illustrating an embodiment of a fan mount.
Figure 2B:
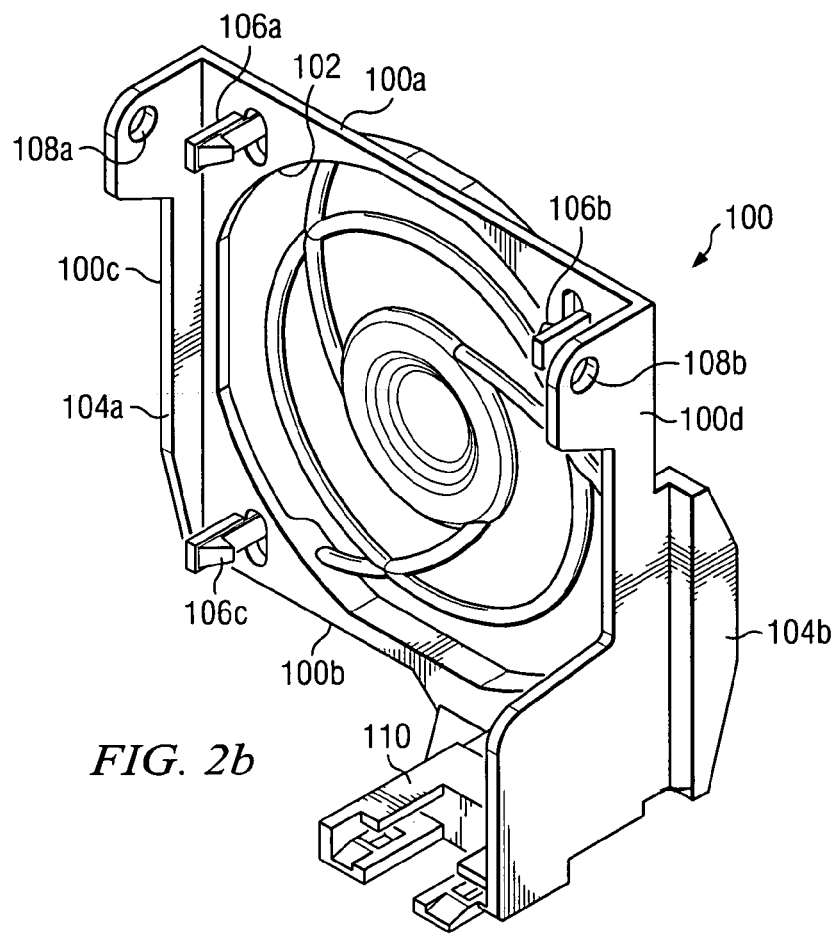
Figure 2C:
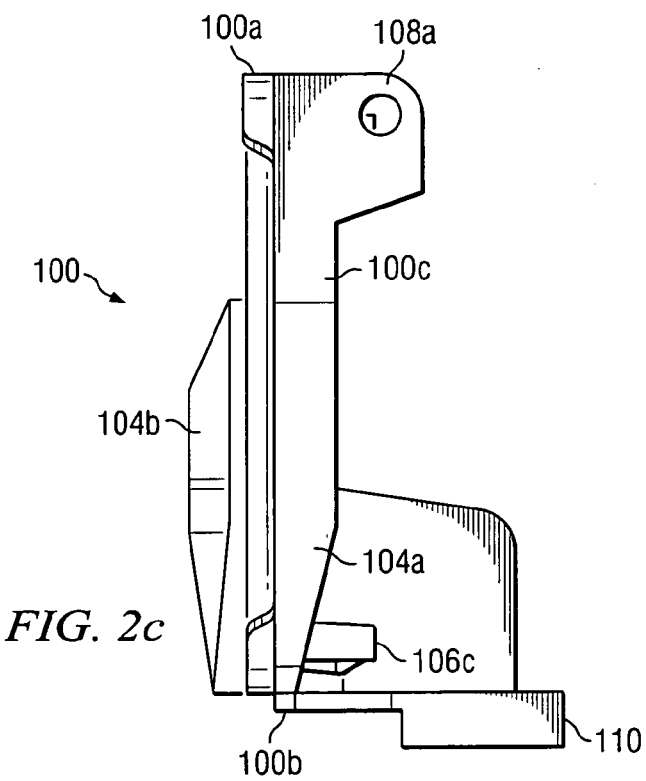

Referring now to FIGS. 2a, 2b, and 2c, a fan mount 100 is illustrated. Fan mount 100 includes a top 100a, a bottom 100b positioned opposite the top 100a, a side 100c, and a side 100d positioned opposite the side 100c. An aperture 102 is defined by the fan mount 100 and positioned between the top 100a, the bottom 100b, and the sides 100c and 100d. A base coupler 104a is located on the side 100c and a base coupler 104b extends from the fan mount 100 and is positioned adjacent the side 100d. A plurality of fan couplers 106a, 106b, 106c and 106d extend from the fan mount 100 and are positioned in a spaced apart relationship around the edge of the aperture 102. A latch coupling 108a extends from side 100c of the fan mount 100 and is positioned adjacent the top 100a of the fan mount. A latch coupling 108b extends from side 100d of the fan mount 100 and is positioned adjacent the top 100a of the fan mount 100. A plug mount 110 extends from the bottom 100b of the fan mount 100 and is positioned adjacent the side 100d of the fan mount.

Figure 3:
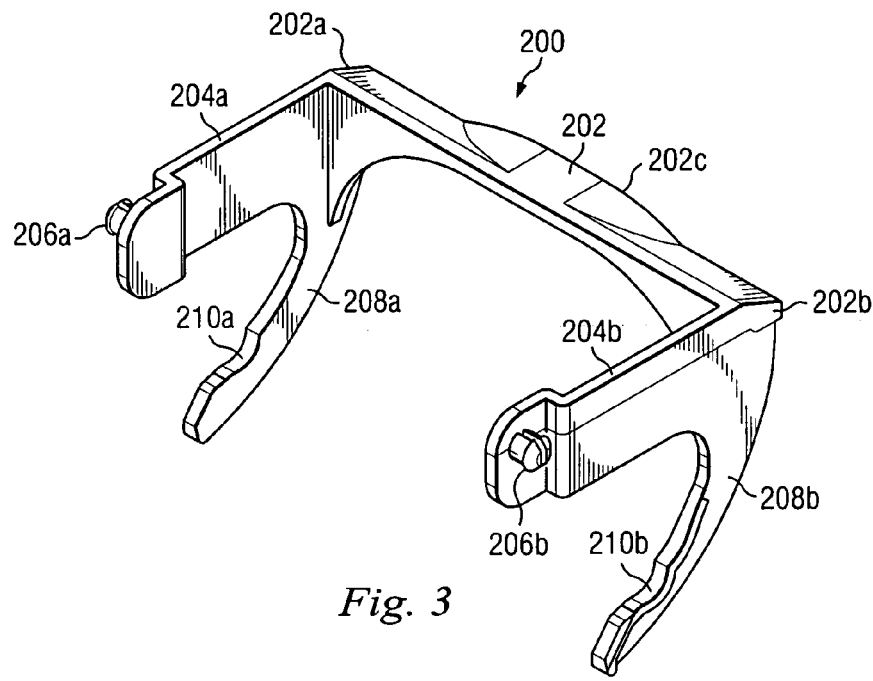
FIG. 3 is a perspective view illustrating an embodiment of a latch member used with the fan mount of FIG. 2a FIG. 4 is a perspective view illustrating an embodiment of a base used with the fan mount of FIG. 2a and the latch member of FIG. 3.

Referring now to FIG. 3, a latch member 200 is illustrated. Latch member 200 includes an elongated duct member 202 having an end 202a, an end 202b positioned opposite the end 202a, and a hood 202c extending from the duct member 202 between the ends 202a and 202b and operable to direct airflow past the latch member 200. A plurality of arms 204a and 204b extend from the ends 202a and 202b, respectively, of the duct member 202 in a substantially perpendicular orientation with respect to the duct member 202, each arm 204a and 204b including a fan mount coupler 206a and 206b, respectively, adjacent its distal end. A plurality of latching arms 208a and 208b also extend from the ends 202a and 202b, respectively, of the duct member 202, with each latching arm 208a and 208b defining a latching channel 210a and 210b, respectively, adjacent its distal end.

Figure 4:
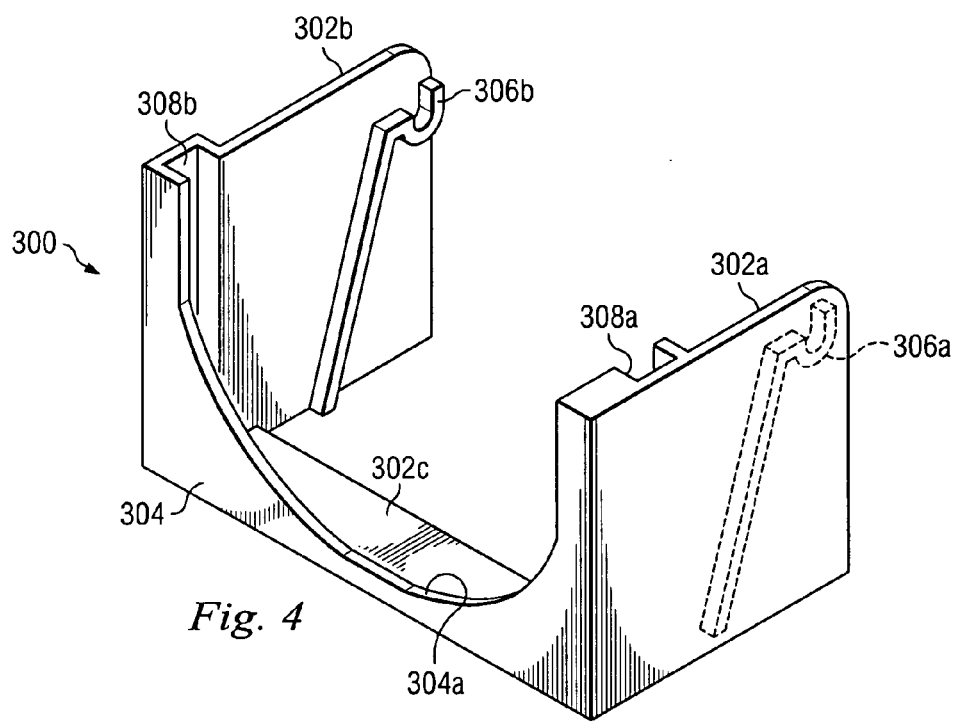

Referring now to FIG. 4, a base 300 is illustrated. Base 300 includes a plurality of sides 302a and 302b which are coupled together in a substantially parallel and spaced apart relationship by a board mount 302c. A wall 304 extends between the sides 302a and 302b and from the board mount 302c and defines a passageway 304a in the base 300. A latch coupler 306a extends from the side 302a of the base 300 and adjacent the front of the base 300. A latch coupler 306b extends from the side 302b of the base 300 and adjacent the front of the base 300. A mount coupler channel 308a is defined by the side 302a and is positioned adjacent the board mount 302c and the wall 304. A mount coupler channel 308b is defined by the side 302b and is positioned adjacent the board mount 302c and the wall 304. In an embodiment, the mount coupler channels 308a and 308b provide a mount coupler on the base member 300.

Figure 5:
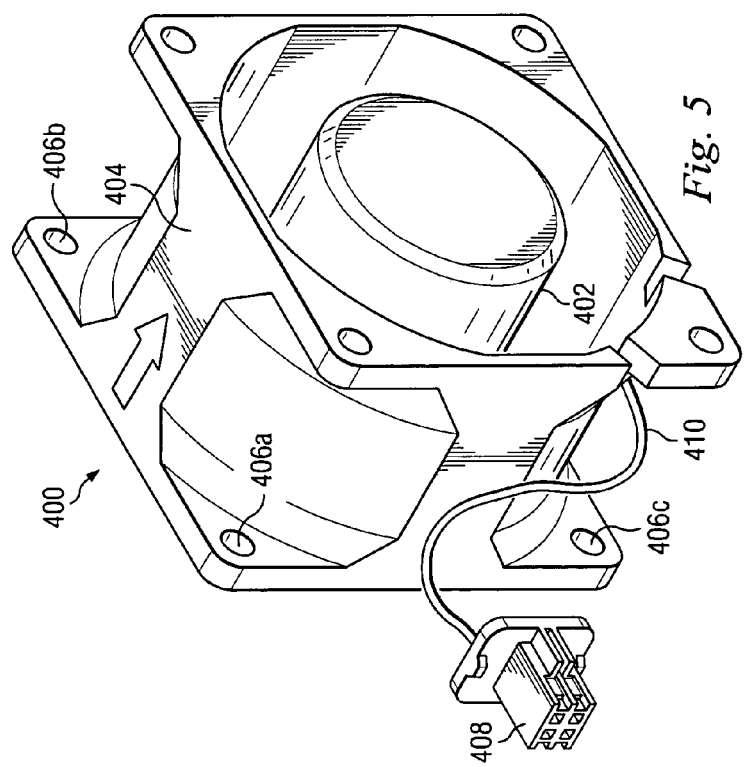
FIG. 5 is a perspective view illustrating an embodiment of a fan used with the fan mount of FIG. 2a, the latch member of FIG. 3, and the base of FIG. 4.

Referring now to FIG. 5, a fan module 400 is illustrated. Fan module 400 includes a conventional fan 402 which is mounted in a fan chassis 404. Fan chassis 404 defines a plurality of apertures 406a, 406b, 406c, and 406d (not shown), positioned in a spaced apart relationship on opposite corners of the fan chassis 404. A plug 408 is coupled to the conventional fan 402 by an electrical coupling 410.

Figure 6A:
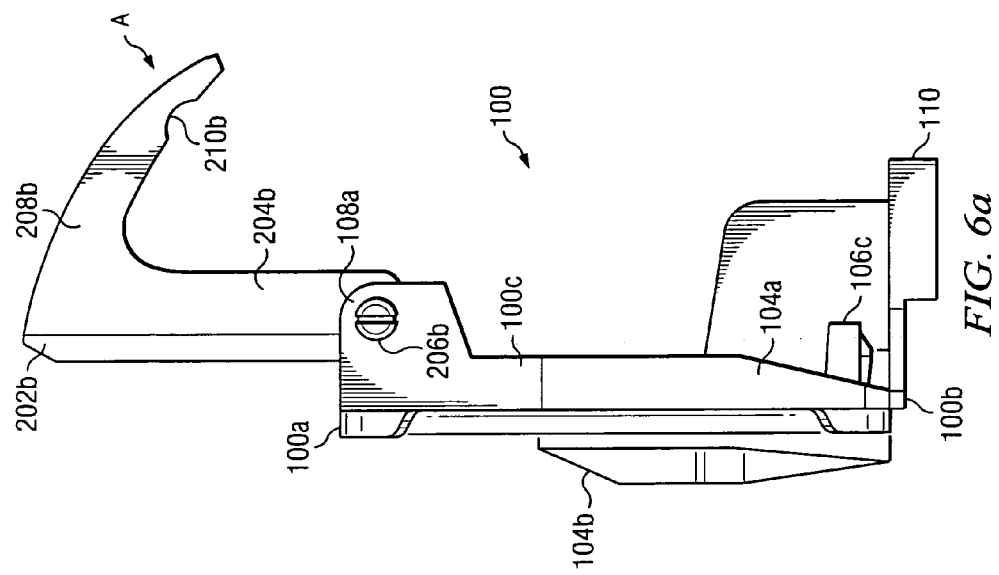
FIG. 6a is a side view illustrating an embodiment of the latch member of FIG. 3 pivotally coupled to the fan mount of FIG. 2a and in a first orientation.
Figure 6C:
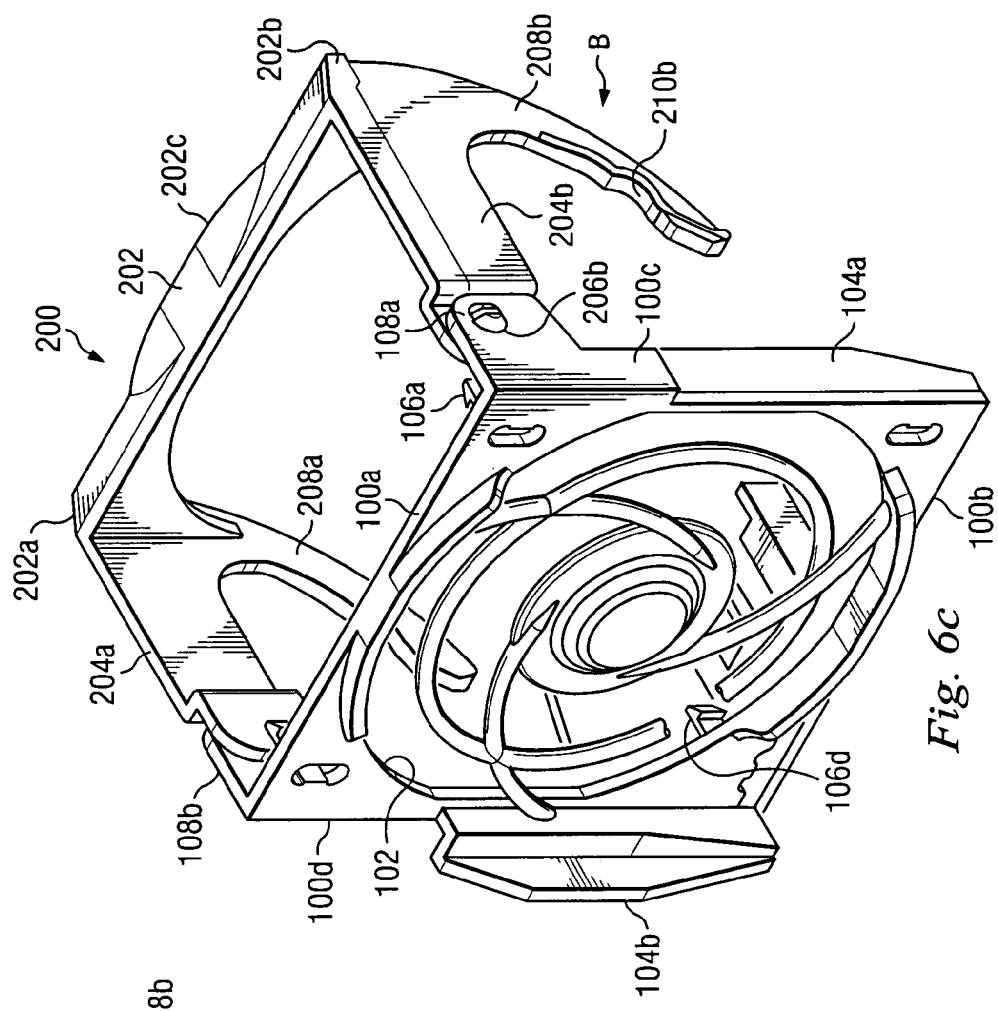
FIG. 6c is a perspective view illustrating an embodiment of the latch member and the fan mount of FIG. 6b.
Figure 6B:
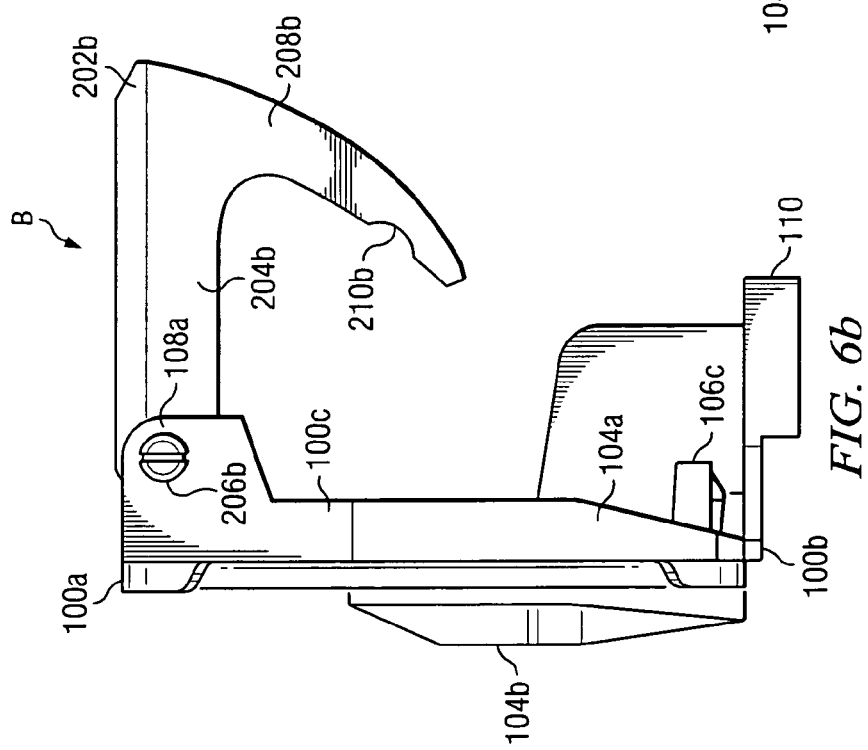
FIG. 6b is a side view illustrating an embodiment of the latch member of FIG. 3 pivotally coupled to the fan mount of FIG. 2a and in a second orientation.

Referring now to FIGS. 6a, 6b, and 6c, in operation, the latch member 200 is pivotally coupled to the fan mount 100 by coupling fan mount coupler 206b on latch member 200 to latch coupling 108a on fan mount 100 and by coupling fan mount coupler 206a on latch member 200 to latch coupling 108b on fan mount 100. The pivotal coupling of latch member 200 to the fan mount 100 allows the latch member 200 to be oriented in a position A, illustrated in FIG. 6a. The pivotal coupling of latch member 200 to the fan mount 100 also allows the latch member 200 to pivot with respect to the fan mount 100 and into a position B, illustrated in FIGS. 6b and 6c.

Figure 7A:
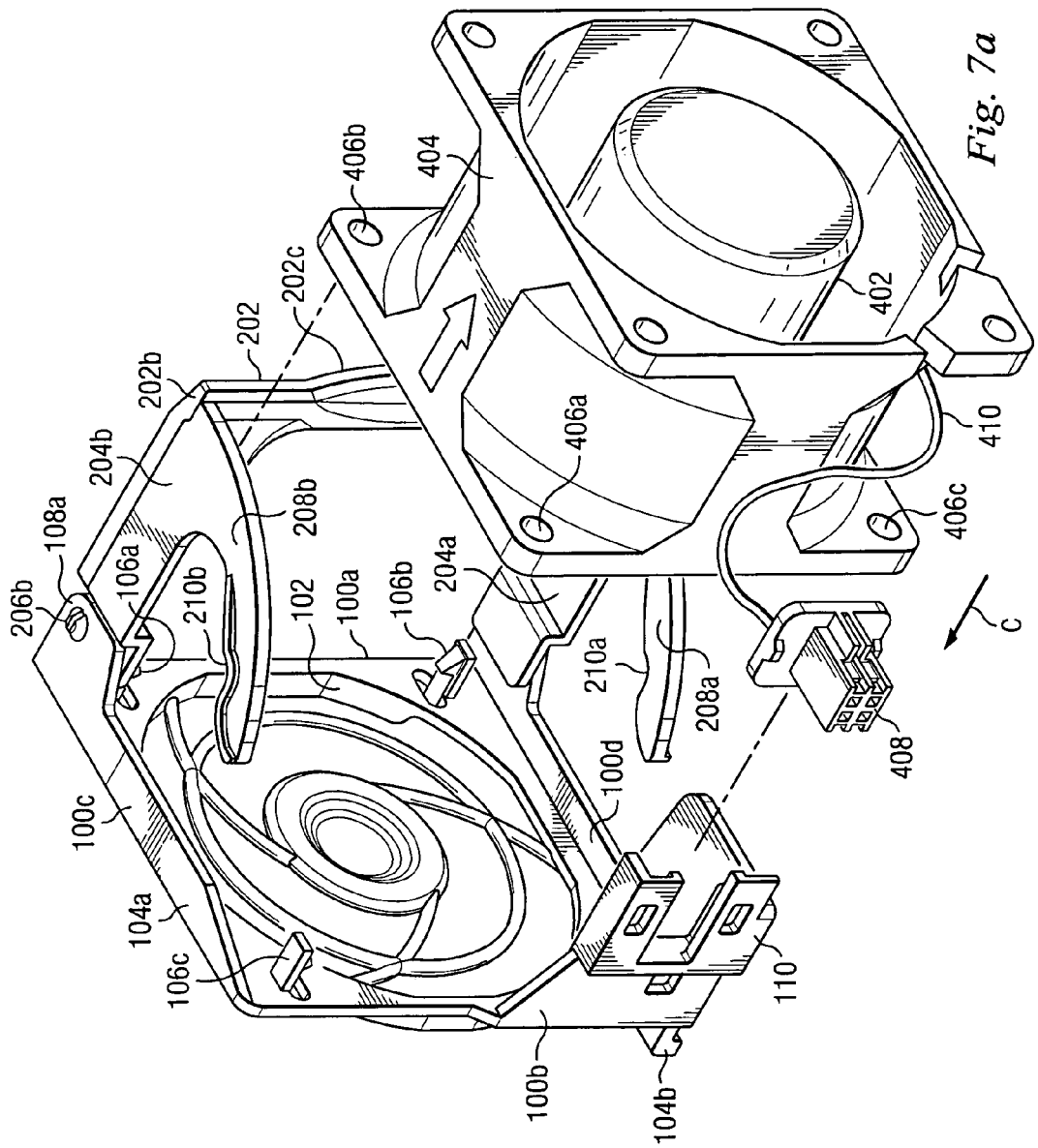
FIG. 7a is a perspective view illustrating an embodiment of the fan of FIG. 5 being coupled to the fan mount and latch member of FIG. 6c.
Figure 7B:
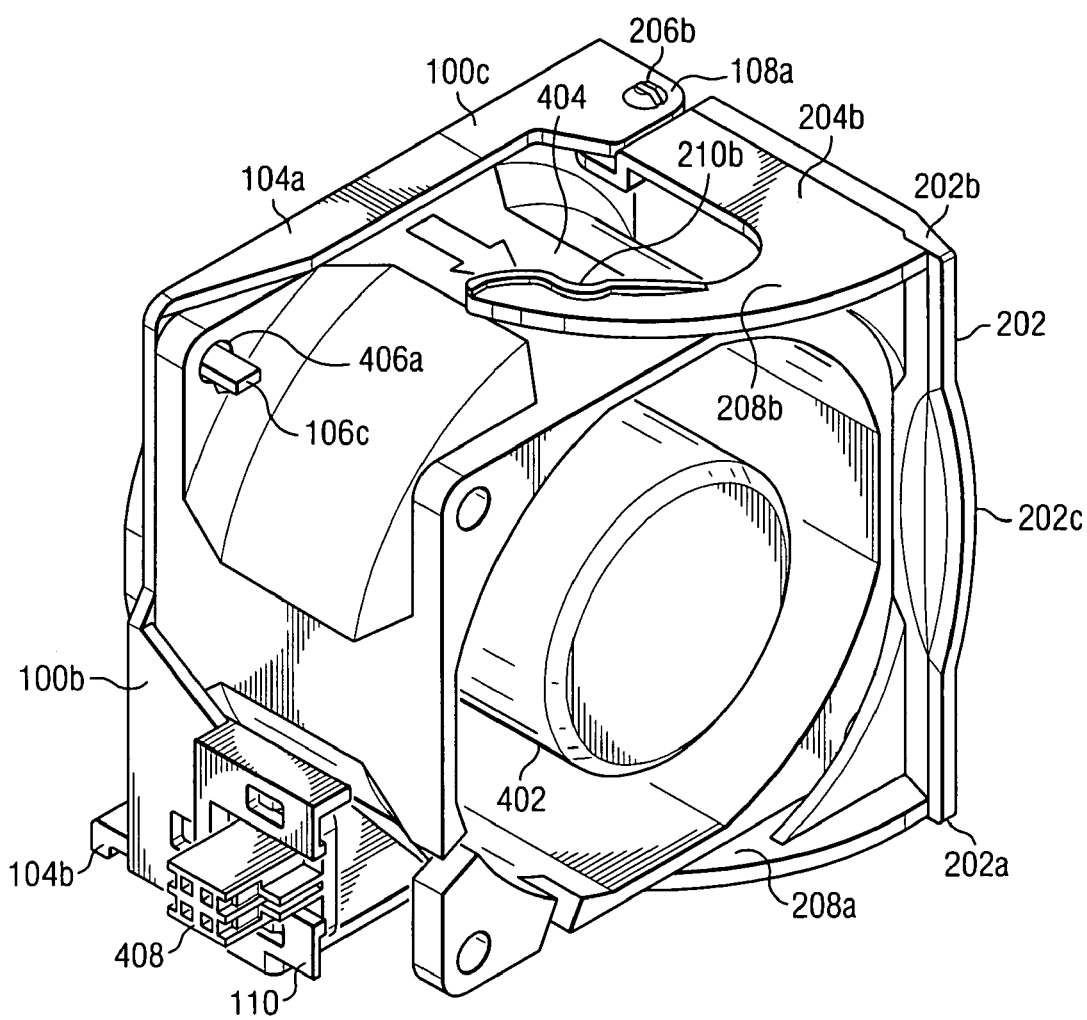
FIG. 7b is a perspective view illustrating an embodiment of the fan of FIG. 5 coupled to the fan mount and latch member of FIG. 6c.
Figure 7C:
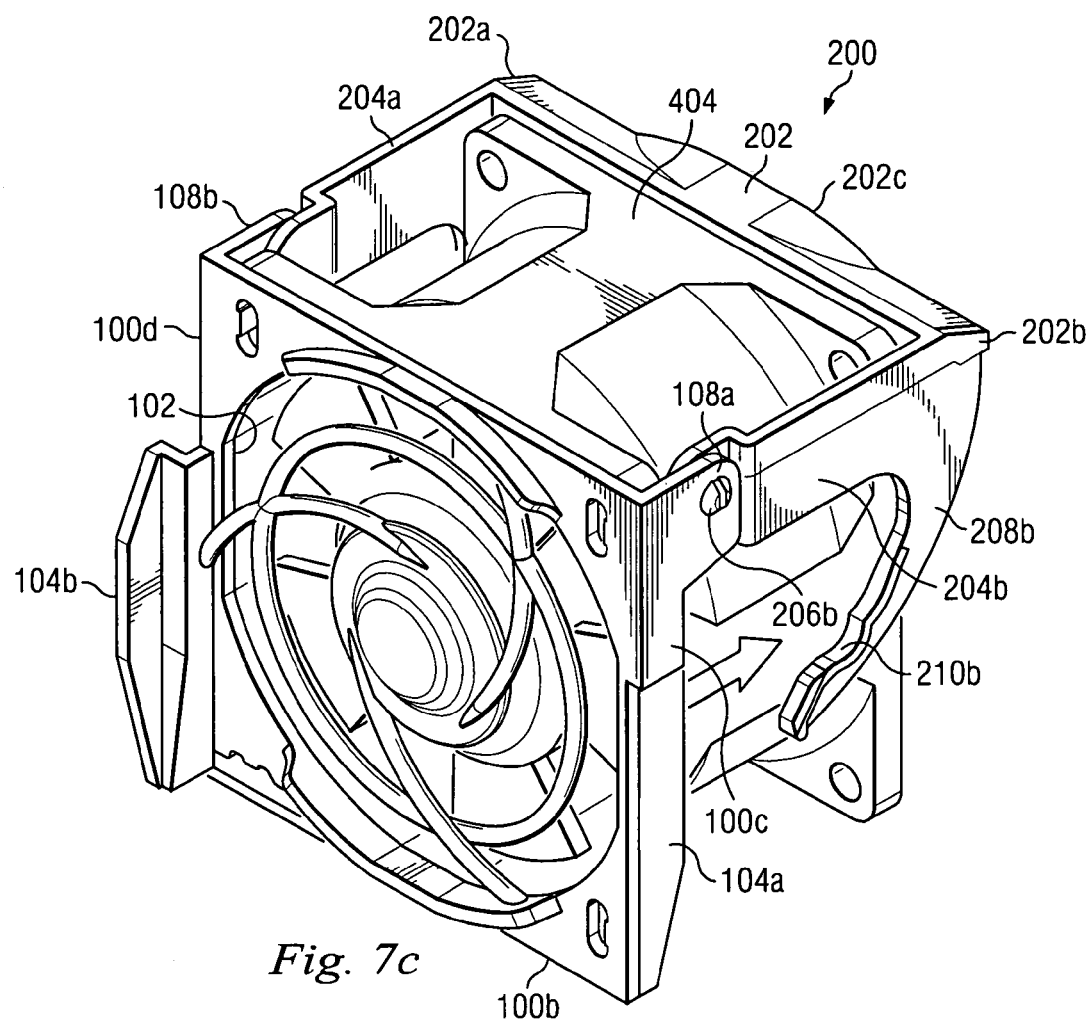
FIG. 7c is a perspective view illustrating an embodiment of the fan, the latch member and the fan mount of FIG. 7b.

Referring now to FIGS. 7a, 7b, and 7c, the fan module 400 is coupled to the fan mount 100 by positioning the fan module 400 adjacent the fan mount 100 such that apertures 406a, 406b, 406c, and 406d (not shown) line up with fan couplers 106c, 106a, 106d (not shown), and 106b, respectively. The fan module 400 is then moved in a direction C such that the fan couplers 106c, 106a, 106d, and 106b engage the apertures 406a, 406b, 406c, and 406d, which secures the fan module 400 to the fan mount 100. The plug 408 coupled to fan module 400 may then be coupled to the plug mount 110 on fan mount 100, as illustrated in FIG. 7b.

Figure 8C:
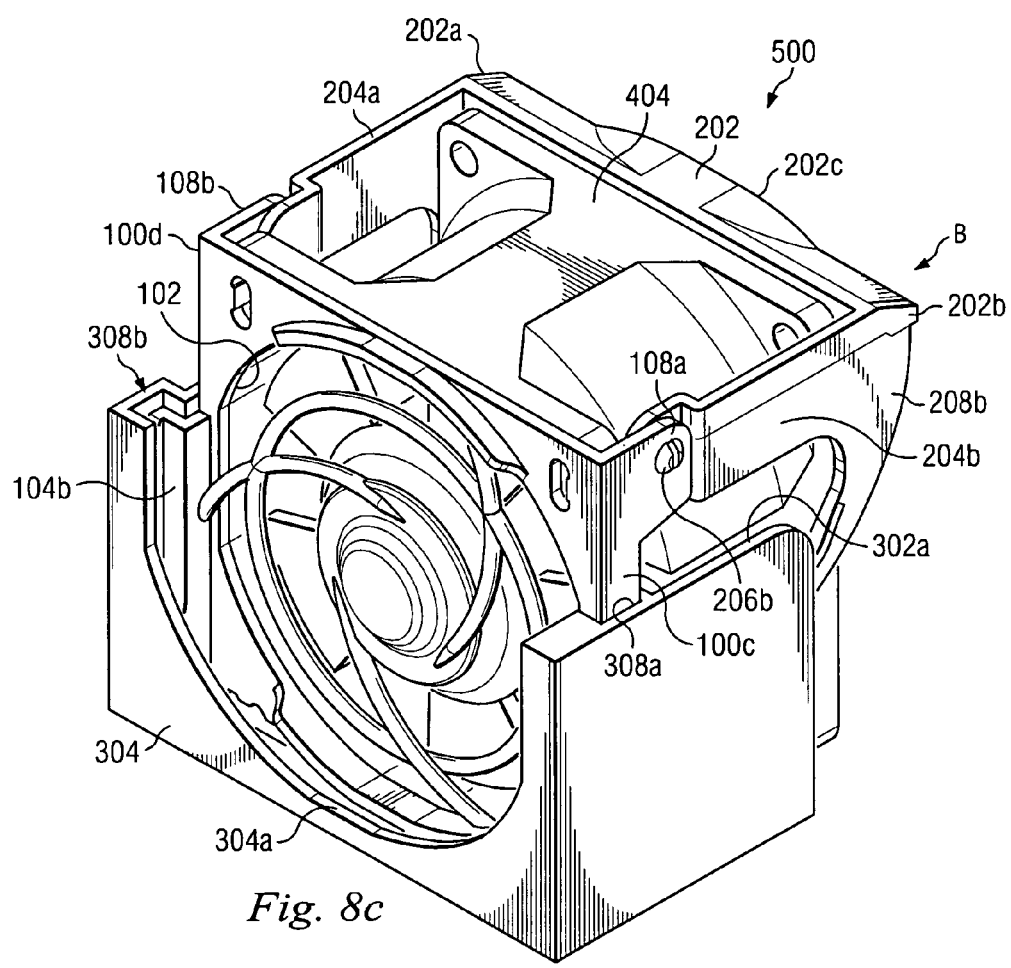
FIG. 8c is a perspective view illustrating an embodiment of the fan, the latch member, the fan mount, and the base of FIG. 8b.

Referring now to FIGS. 3, 4, 7c, 8a, 8b, and 8c, with the fan module 400 and the latch member 200 coupled to the fan mount 100, the fan mount 100 may be coupled to the base 300. With latch member 200 oriented in position A, as illustrated in FIG. 8a, duct member 202 provides a handle which allows for one-handed positioning the fan module 400 and the fan mount 100. The fan mount 100 is then positioned adjacent the base 300 such that base coupler 104a is lined up with mount coupler channel 308a and base coupler 104b is lined up with mount coupler channel 308b. The fan mount 100 is then lowered such that base couplers 104a and 104b engage mount coupler channels 308a and 308b, respectively, and the bottom 100b of fan mount 100 engages board mount 302c, as illustrated in FIG. 8b. With the bottom 100b of fan mount 100 engages board mount 302c, plug 408 extends out from the bottom of base 300, and aperture 102 on fan mount 100 lines up with passageway 304a on base 300 to allow airflow through the base 300, the fan mount 100, and to the fan module 400. Latch member 200 may then be pivoted into position B, illustrated in FIG. 8c. Pivoting latch member 200 into position B engages the latch member 200 with the fan chassis 404 and engages latching channels 210a and 210b on latching arms 208a and 208b, respectively, with latch couplers 306b and 306a, respectively, on base 300. Pivoting latch member 200 into position B and engaging latching channels 210a and 210b on latching arms 208a and 208b, respectively, with latch couplers 306b and 306a, respectively, on base 300 secures the fan module 400 to the base 300 under a load in order to reduce vibrations from the fan module 400 when it is operated. Furthermore, pivoting latch member 200 into position B and securing the fan module 400 to the base 300 provides a compliant member to account for assembly tolerances that can result in gaps that produce vibration between parts. Pivoting latch member 200 into position B also positions the hood 202d on duct member 202 immediately adjacent the fan module 400 in order to direct airflow from the fan module 400. In an embodiment, the fan mount 100, latch member 200, and base 300 provide a fan mounting apparatus 500. The fan module 400 may then be removed from the base 300 by disengaging latching channels 210a and 210b from latch couplers 306b and 306a, respectively, pivoting the latch member 200 back to position A, and using the duct member 202 as a handle to pull the fan mount 100 out of the base 300. Thus, a fan mounting apparatus 500 is provided which provides one-handed installation and removal of the fan module 400 to and from the base 300, a means for reducing vibrations from the fan module 400, and a means for directing the airflow from the fan module 400.

Figure 9A:
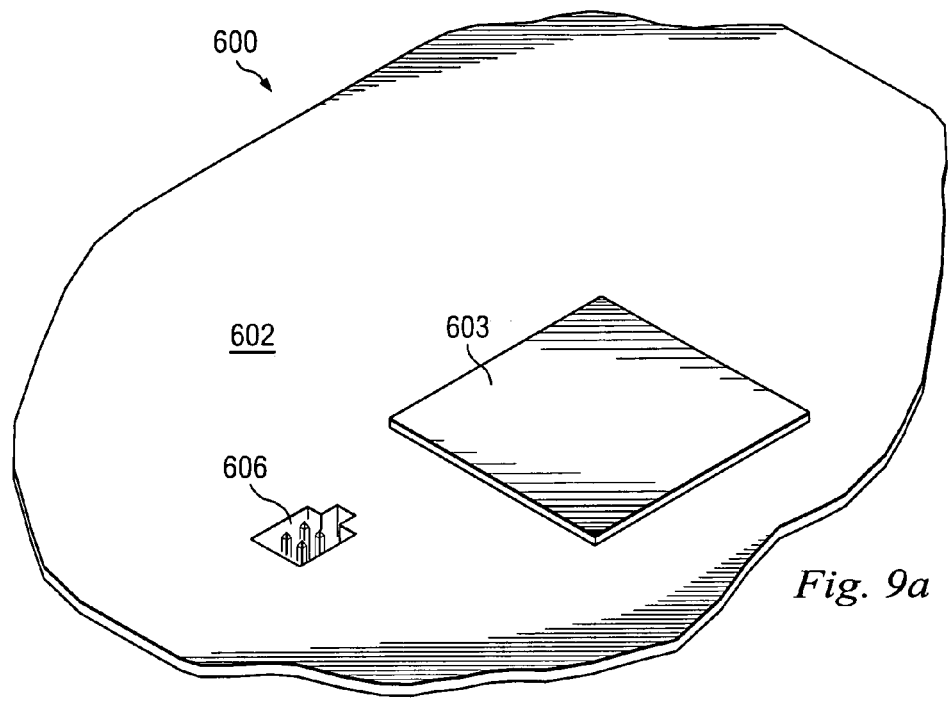
FIG. 9a is a perspective view illustrating an embodiment of a board and a heat producing component used with the fan, the latch member, the fan mount, and the base of FIG. 8c.
Figure 9B:
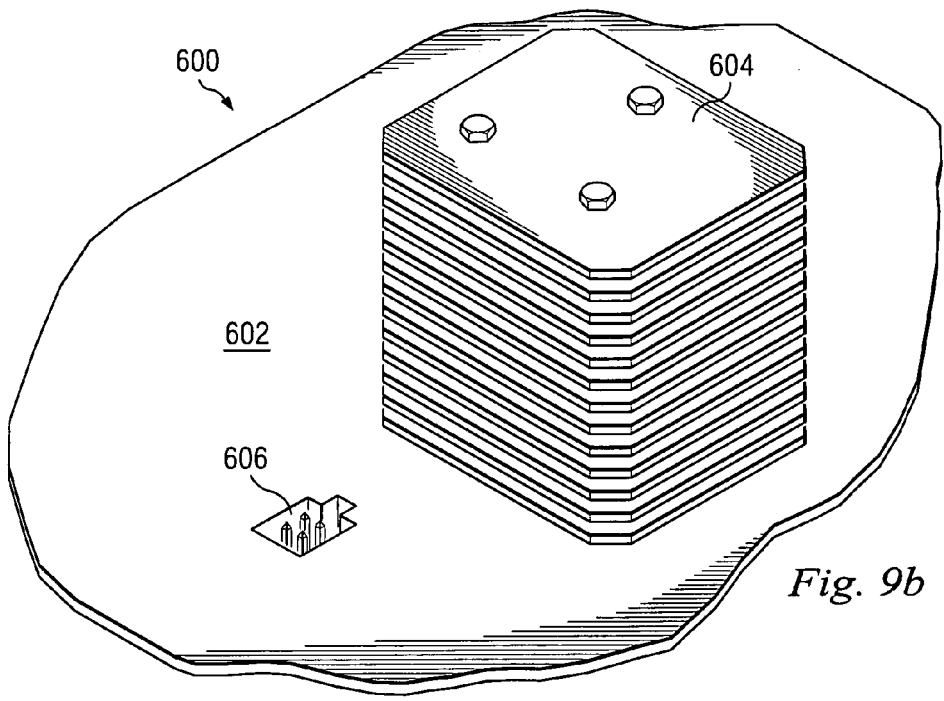

Referring now to FIGS. 9a and 9b, in an embodiment, a fan mounting apparatus 600 is substantially identical in structure and operation to the fan mounting apparatus 500 described above with reference to FIGS. 1, 2a, 2b, 2c, 3, 4, 5, 6a, 6b, 6c, 7a, 7b, 7c, 8a, 8b, and 8c, with the addition of a board 602. Board 602 may be mounted in a chassis such as, for example, the chassis 26 illustrated in FIG. 1, and may include components of an information handling system such as, for example, the information handling system 10 illustrated in FIG. 1. Board 602 includes heat-producing component 603 which may be a variety of heat-producing component known in the art such as, for example, the microprocessor 12 illustrated in FIG. 1. A heat sink 604 is coupled to the board 602 and the heat-producing component 603, as illustrated in FIG. 9b. An electrical coupling channel 606 is defined by the board 602, positioned adjacent the heat sink 604, and coupled to a power supply (not shown).

Figure 10:
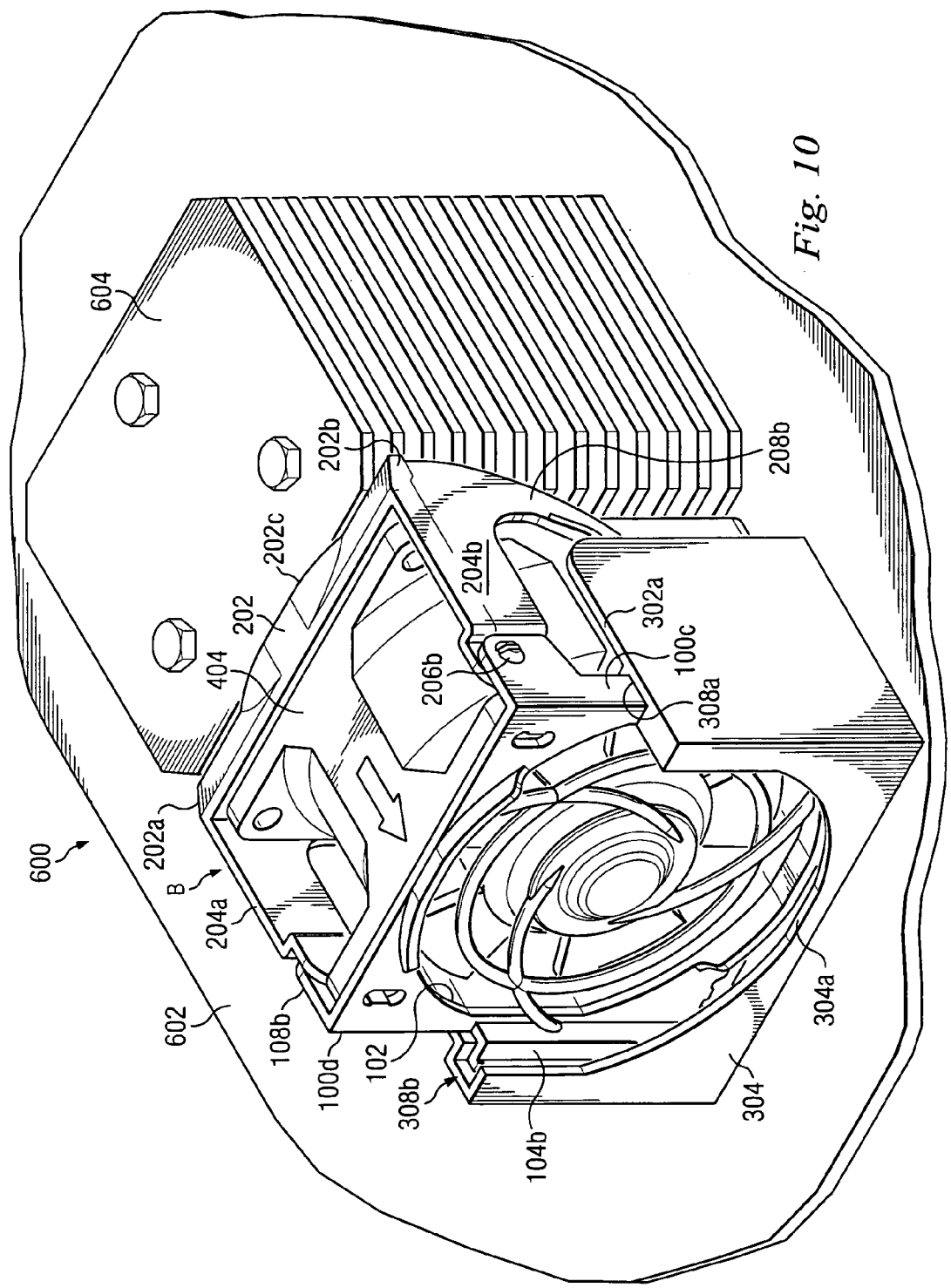
FIG. 10 is a perspective view illustrating an embodiment of the fan, the latch member, the fan mount, and the base of FIG. 8c coupled to the board and adjacent the heat sink of FIG. 9.

Referring now to FIG. 10, in operation, the base 300 may be mounted to the board 602 adjacent the heat sink 604 by coupling the board mount 302c to the board 602 using conventional methods known in the art. With the base 300 mounted to the board 602, the fan module 400 may be positioned adjacent the heat sink 604 by coupling the fan mount 100 to the base 300 as described above with reference to FIGS. 8a, 8b, and 8c. The coupling of the fan mount 100 to the base 300 results in the plug 408 on fan module 400 engaging the electrical coupling channel 606 defined by the board 602 and electrically couples the fan module 400 to the power supply (not shown). With the latch member 200 in position B, vibration from the fan module 400 is reduced and the hood 202c and duct member 202 direct airflow from the fan module 400 directly onto the heat sink 604. Pivoting latch member 200 into position B and engaging latching channels 210a and 210b on latching arms 208a and 208b, respectively, with latch couplers 306b and 306a, respec- tively, on base 300 secures the fan module 400 to the base 300 under a load in order to reduce vibrations from the fan module 400 when it is operated. In addition, pivoting latch member 200 into position B and securing the fan module 400 to the base 300 provides a compliant member to account for assembly tolerances that can result in gaps that produce vibration between parts. Furthermore, pivoting latch member 200 into position B and securing the fan module 400 to the base 300 creates an overmated condition between the plug 408 on fan module 400 and the electrical coupling channel 606 defined by board 602 in order to ensure electrical coupling between the fan module 400 and the power supply (not shown). Thus, a fan mounting apparatus 600 is provided which provides one-handed installation and removal of the fan module 400 to and from the base 300, a means for reducing vibrations from the fan module 400, and a means for directing the airflow from the fan module 400 to the heat sink 604.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A fan mounting apparatus comprising:
   a base;
   a fan mount which is operable to couple to the base; and
   a latch member pivotally coupled to the fan mount, the latch member operable to reduce vibration from a fan module and including a duct member operable to direct airflow from the fan module.

2. The apparatus of claim 1 wherein the base includes a mount coupler which is operable to couple the fan mount to the base.

3. The apparatus of claim 1 wherein the base includes a latch coupler which is operable to couple the latch member to the base in order to reduce fan vibration.

4. The apparatus of claim 1 wherein the base defines a passageway for allowing airflow through the base.

5. The apparatus of claim 1 wherein the fan mount includes a fan coupler which is operable to couple a fan module to the fan mount.

6. The apparatus of claim 1 wherein the fan mount includes a base coupler which is operable to couple the fan mount to the base.

7. The apparatus of claim 1 wherein the fan mount defines an aperture operable to allow airflow through the fan mount.

8. The apparatus of claim 1 wherein the latch member is operable to couple to the base in order to reduce fan vibration.

9. The apparatus of claim 7 wherein the duct member is operable to direct airflow when the latch member is coupled to the base.

10. The apparatus of claim 1 wherein the latch member is operable to provide a handle for coupling of the fan mount with the base.

11. An information handling system comprising:
    a board;
    a heat generating component mounted to the board;
    a base mounted to the board adjacent the heat generating component and including a latch coupler;
    a fan mount which is operable to couple to the base;
    a fan module which is operable to couple to the fan mount; and a latch member pivotally coupled to the fan mount, whereby the latch member is operable to reduce fan vibration by coupling to the latch coupler when the fan module is coupled to the fan mount and includes a duct member operable to direct airflow from the fan module.

12. The system of claim 11 wherein the base includes a mount coupler which is operable to couple the fan mount to the base.

13. The system of claim 11 wherein the base defines a passageway for allowing airflow through the base and to the fan module.

14. The system of claim 11 wherein the fan mount includes a fan coupler which is operable to couple the fan module to the fan mount.

15. The system of claim 11 wherein the fan mount includes a base coupler which is operable to couple the fan mount to the base.

16. The system of claim 11 wherein the fan mount defines an aperture operable to allow airflow through the fan mount and to the fan module.

17. The system of claim 11 wherein the duct member is operable to direct airflow when the latch member is coupled to the latch coupler.

18. The system of claim 11 wherein the latch member is operable to provide a handle for coupling of the fan module and the fan mount with the base.

19. The system of claim 11 wherein the fan includes a plug which is operable to electrically couple the fan module to the board when the fan module is coupled to the fan mount and the fan mount is coupled to the base.

20. The system of claim 11 further comprising:
a heat sink mounted to the board adjacent the base, whereby the duct member is operable to direct airflow from the fan module to the heat sink when the fan module is coupled to the fan mount and the fan mount is couple to the base.

21. An information handling system comprising:
a circuit board;
a microprocessor mounted to the circuit board;
a storage coupled to the microprocessor;
a base mounted to the circuit board adjacent the microprocessor and including a latch coupler;
a fan mount which is operable to couple to the base;
a fan module which is operable to couple to the fan mount; and
a latch member pivotally coupled to the fan mount, whereby the latch member is operable to reduce fan vibration by coupling to the latch coupler when the fan module is coupled to the fan mount and includes a duct member operable to direct airflow from the fan module.

22. A method for mounting a fan comprising:
mounting a base to a board;
coupling a fan module to a fan mount, the fan mount including a latch member pivotally coupled to the fan mount and having a duct member which is operable to direct airflow;
coupling the fan mount to the base;
coupling the latch member to the base; and
directing airflow from the fan with the duct member.

23. The method of claim 22 further comprising:
mounting a heat sink adjacent the base, whereby the directing airflow from the fan module with the duct member includes directing airflow to the heat sink.

24. The method of claim 22 wherein the coupling the latch member to the base is operable to reduce fan vibration when the fan module is operated.

25. The method of claim 22 wherein the coupling of the fan mount to the base is operable to electrically couple the fan module to the board.

* * * * *